(12) United States Patent
Duppong et al.

(10) Patent No.: US 7,940,530 B2
(45) Date of Patent: May 10, 2011

(54) CIRCUIT BOARD ARRANGEMENT AND METHOD OF MOUNTING CIRCUIT BOARDS IN A WORK MACHINE

(75) Inventors: Jeffrey Scott Duppong, Fargo, ND (US); Dale Arthur Janssen, Fargo, ND (US); Amanda Renee Wyland, Glyndon, MN (US); Richard James Livdahl, West Fargo, ND (US); Vincent Guy Segal, Fargo, ND (US); Travis Lee Johnston, Fargo, ND (US); Nathan Matthew Hawk, Fargo, ND (US)

(73) Assignee: Deere & Company, Moline, IL (US)

( * ) Notice: Subject to any disclaimer, the term of this patent is extended or adjusted under 35 U.S.C. 154(b) by 1167 days.

(21) Appl. No.: 11/541,840

(22) Filed: Oct. 2, 2006

(65) Prior Publication Data
US 2008/0080152 A1 Apr. 3, 2008

(51) Int. Cl.
*H05K 7/00* (2006.01)
(52) U.S. Cl. ........................................ 361/760
(58) Field of Classification Search .................. 361/760
See application file for complete search history.

(56) References Cited

U.S. PATENT DOCUMENTS

| | | | |
|---|---|---|---|
| 3,829,741 A * | 8/1974 | Athey | 361/756 |
| 3,932,016 A | 1/1976 | Ammenheuser | |
| 5,642,263 A | 6/1997 | Lauruhn | |
| 5,726,865 A | 3/1998 | Webb et al. | |
| 5,902,143 A | 5/1999 | Pan et al. | |
| 6,056,574 A | 5/2000 | Yeomans et al. | |
| 6,064,574 A | 5/2000 | Yu et al. | |
| 6,083,026 A * | 7/2000 | Trout et al. | 439/328 |
| 6,095,822 A | 8/2000 | Corisis et al. | |
| 6,160,706 A | 12/2000 | Davis et al. | |
| 6,219,251 B1 | 4/2001 | Wang | |
| 6,310,779 B1 | 10/2001 | Wang | |
| 6,320,750 B2 * | 11/2001 | Shaler et al. | 361/736 |
| 6,891,729 B2 * | 5/2005 | Ko et al. | 361/736 |
| 7,641,495 B1 | 1/2010 | Sun | |
| 2005/0009396 A1 * | 1/2005 | Wu | 439/327 |

FOREIGN PATENT DOCUMENTS

| | | |
|---|---|---|
| DE | 2516746 | 10/1976 |
| DE | 3422768 | 1/1986 |

OTHER PUBLICATIONS

Vertical Mount Card Guide. Catalog [online]. Richco Inc., [retrieved on Oct. 2, 2006] Internet: <URL: http://www.richco-inc.com/group_details.asp?seccode=100&grpcode=005>.
Circuit Board Guide. Catalog [online]. Richco Inc., [retrieved on Oct. 2, 2006] Internet: <URL: http://www.richco-inc.com/group_details.asp?seccode=100&grpcode=010>.

* cited by examiner

*Primary Examiner* — Jinhee J Lee
*Assistant Examiner* — Abiy Getachew

(57) ABSTRACT

A circuit board arrangement includes a first printed circuit board having a first edge connector and a second printed circuit board having a second edge connector. The first edge connector includes a plurality of fingers, with each finger having at least one first conductor pad. The second edge connector includes a plurality of openings positioned generally in line with each other and a plurality of second conductor pads. Each opening has a corresponding finger positioned therein. Each second conductor pad is positioned adjacent a corresponding opening and corresponding first conductor pad.

14 Claims, 3 Drawing Sheets

CIRCUIT BOARD ARRANGEMENT AND METHOD OF MOUNTING CIRCUIT BOARDS IN A WORK MACHINE

FIELD OF THE INVENTION

The present invention relates to printed circuit board arrangements for use in work machines, and, more particularly, to circuit board guides used to hold one circuit board in relation to another circuit board.

BACKGROUND OF THE INVENTION

Work machines such as agricultural tractors, combines, construction and forestry equipment continually rely to a greater extent upon electronics and electronic controls. Work machines may operate in extreme environments compared to other applications. Among other concerns, it is necessary for on-board electronics to be designed from an electronics packaging standpoint with vibration, heat transfer and electromagnetic interference (EMI) in mind. Thus, electronics for work machines must be generally of a robust design.

A common method of mounting a daughterboard to a motherboard is using a commercially available plastic circuit board guide, such as available from RichCo (see http://www.richco-inc.com). Referring to FIG. 1, these circuit board guides snap through slots in the motherboard and project up from the surface of the motherboard. The daughterboard slides down in grooves formed on the edges of the circuit board guides. Small wings near the base of the guide, seen more clearly in FIG. 2, extend out and make contact with the motherboard to provide some stability (limits side-to-side movement). Flaps on the bottom of the base act like a harpoon head, first pushing through the mother board and then snapping out to prevent inadvertent removal.

Another type of commercially available circuit board guide referred to as a vertical mount card guide is more rigid in that is made of metal and mounts by screwing tightly into the motherboard. A number of screws pass through holes in the motherboard and screw into the base of the vertical mount card guide.

Commercially available circuit board guides as described above include certain inherent problems. For example, with a circuit board guide as described above, there is a certain amount of "float" of the circuit board in the tracks of the guide. This float can be back and forth in the track or up and down (away from and toward the motherboard).

Moreover, known circuit board guides do not guarantee a high degree of perpendicularity between the daughterboard and motherboard. Although a vertical mount card guide may do a better job of guaranteeing perpendicularity by requiring screws to mount the guides to the motherboard, the screws add cost to the unit, both in material cost for the screws, and in labor to attach the screws to the board. Further, circuit board guides available off-the-shelf today are designed for taller circuit boards and computer cards. The typical application of these guides is to fit various circuit boards into a predefined volume of space, such as the casing for a personal computer, and perpendicularity is not necessarily required. Few if any are available for a short profile board which must be rigidly perpendicular to the motherboard.

The electrical connection at the interface between the daughterboard and motherboard can be of various known types, such as with a plug-in edge connector, soldered pins, soldered pads, etc. For example, to complete the electrical connection between the daughterboard and motherboard, solder may be applied between metal pads on one board and similar pads on the second board. The end of the daughterboard is placed such that the pads carried thereby are in close proximity to the pads on the motherboard. Solder "bridging" is when solder flows between two adjacent pads and causes an electrical short circuit. It is not easy to control the placement of solder to form the joint between the two boards. Because the placement of solder is difficult, and because the daughterboard is placed at a 90-degree angle to the motherboard (minimizing surface contact), the solder joints can be weak. If the circuit card guides allow even a small amount of side to side movement, the solder joint can break (causing an open circuit or intermittent contact).

What is needed in the art is a circuit board arrangement in which perpendicularity and electrical contact between the daughterboard and motherboard is ensured, and relative movement between the daughterboard and motherboard is minimized.

SUMMARY OF THE INVENTION

The invention comprises, in one form thereof, a circuit board arrangement including a first printed circuit board having a first edge connector and a second printed circuit board having a second edge connector. The first edge connector includes a plurality of fingers, with each finger having at least one first conductor pad. The second edge connector includes a plurality of openings positioned generally in line with each other and a plurality of second conductor pads. Each opening has a corresponding finger positioned therein. Each second conductor pad is positioned adjacent a corresponding opening and corresponding first conductor pad.

The invention comprises, in another form thereof, a method of mounting a first printed circuit board to a second printed circuit board, including the steps of: inserting a first edge connector of the first printed circuit board into a second edge connector of the second printed circuit board. The first edge connector includes a plurality of fingers on the first printed circuit board, and the second edge connector includes a plurality of aligned openings in the second printed circuit board. Each finger extends through a corresponding opening. At least one first conductor pad carried by each finger is soldered to at least one second conductor pad associated with each opening.

DETAILED DESCRIPTION OF THE INVENTION

Figure 1:
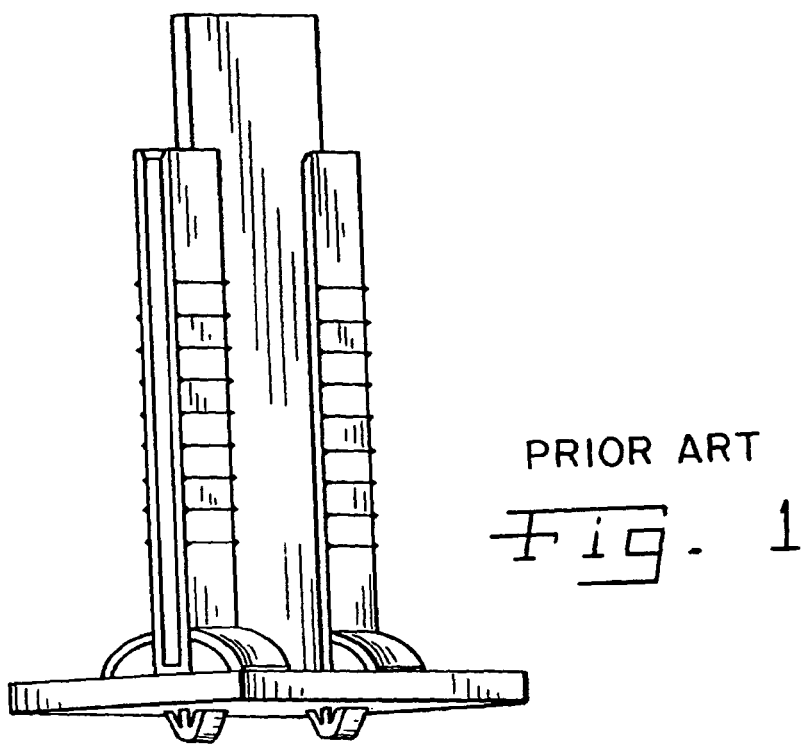
FIG. 1 is a perspective view of a known circuit board guide for interconnecting a daughterboard with a motherboard.
Figure 2:
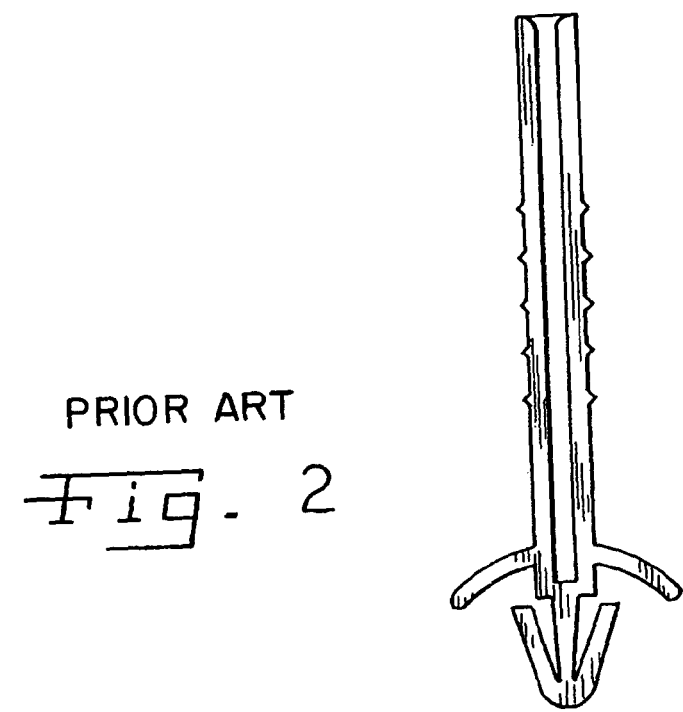
FIG. 2 is a side view of the circuit board guide shown in FIG. 1.
Figure 3:
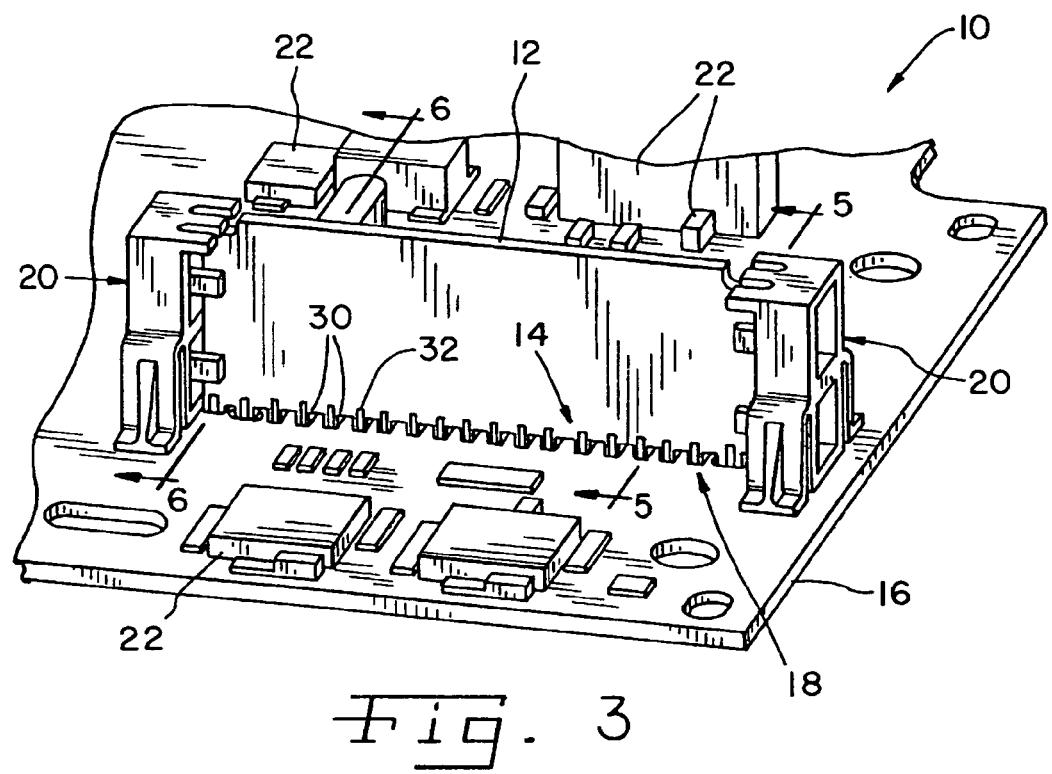
FIG. 3 is a perspective, fragmentary view of an embodiment of a circuit board arrangement of the present invention.
Figure 6:
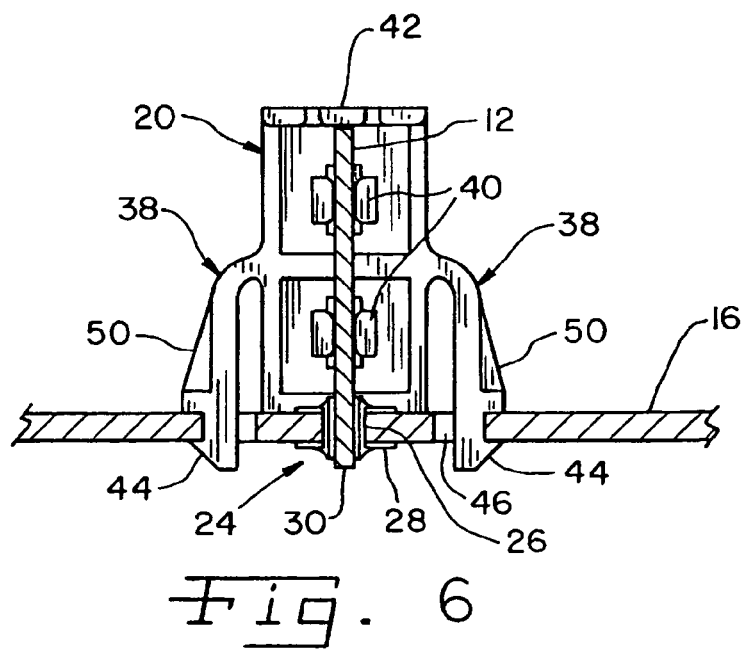
FIG. 6 is a sectional view taken along line 6-6 in FIG. 3.

Referring now to the drawings, and more particularly to FIG. 3, there is shown an embodiment of a circuit board arrangement 10 of the present invention, which generally includes a first printed circuit board (PCB) 12 with a first edge connector 14, a second PCB 16 with a second edge connector 18, a pair of circuit board carriers 20, and other miscellaneous electrical components 22. In the embodiment shown, first PCB 12 is in the form of a daughterboard and second PCB 16 is in the form of a motherboard. However, it is to be understood that circuit board arrangement 10 can be any type of arrangement in which a smaller PCB is electrically and mechanically mounted to a larger PCB.

Figure 5:
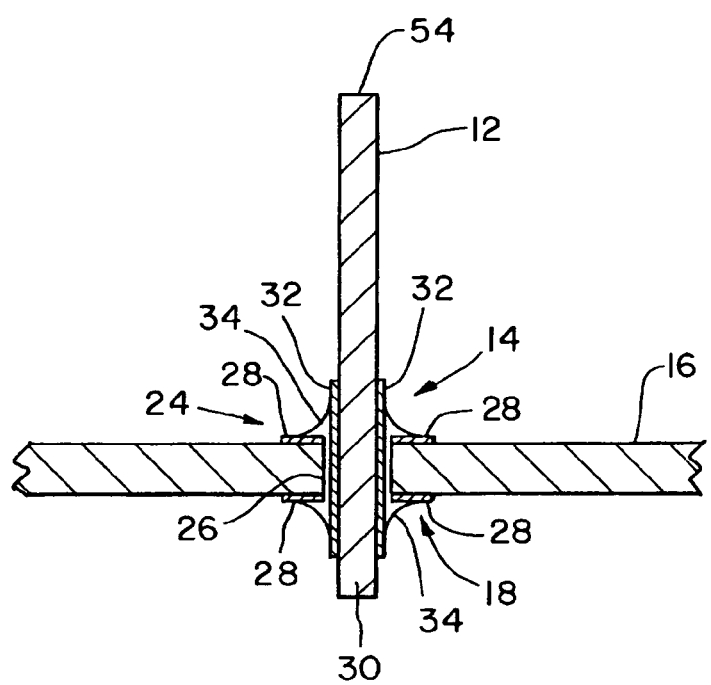
FIG. 5 is a sectional, fragmentary view of an embodiment of a soldered edge connector taken along line 5-5 in FIG. 3.

First edge connector 14 and second edge connector 18 together define a card edge connector 24 (FIGS. 3 and 5). In the embodiment shown, first edge connector 14 and second edge connector 18 together define a metallurgically bonded card edge connector 24. More particularly, first edge connector 14 includes first conductor pads 32 and second edge connector 18 includes second conductor pads 28 which are soldered together. Second edge connector 18 of second PCB 16 includes a plurality of rectangular shaped openings 26 arranged generally in line with each other. Four second conductor pads 28, a pair on each side of second PCB 16, are positioned adjacent opposite lateral side edges of each respective opening 26. Each second conductor pad 28 is electrically coupled with a corresponding trace in second PCB 16. First edge connector 14 of first PCB 12 includes a plurality of fingers 30 which are respectively received within a corresponding opening 26 in second PCB 16. A pair of first conductor pads 32 are positioned on opposite lateral sides of each respective finger 30. Each pair of first conductor pads 32 is electrically coupled with a corresponding trace in first PCB 12, and has a length extending past a corresponding opening 26 on opposite sides of second PCB 16 so as to define a target location for metallurgically bonding a pair of second conductor pads 28 with an adjacent pair of first conductor pads 32. The metallurgic bonding is carried out using a soldering operation, such as a wave soldering operation, that bonds the first conductor pads 32 of a given finger 30 with the adjacent second conductor pads 28, without bridging the solder between first conductor pads 32 of adjacent fingers 30. Such bridging is undesirable and may cause electrical shorting. The wave soldering process results in liquid solder 34 flowing through openings 26 and adhering to both sides of the solder joint as shown in FIG. 5.

A soldered edge connector as described above provides a strong electrical joint that inhibits float between first PCB 12 and second PCB 16. The four (or quadruple) solder joints defined at the inside corners of each finger 30 and second PCB 16 substantially eliminate possible breakage that could occur with weaker joints, and also provide improved heat transfer from first PCB 12 to second PCB 16, or vice versa depending upon the heat generated by the respective electrical components.

With a soldered edge connector 24 as described above, a solder joint is formed at each finger 30 which interconnects a pair of first conductor pads 32 with four second conductor pads 28. However, it may also be possible to form a solder connection at each finger 30 with a different number of metallurgically bonded conductor pads 28 and 32. For example, it may be possible to solder together a pair of conductor pads 28 on a same side of an opening 26 with a single conductor pad 32 on the adjacent side of first PCB 12. Further, it may be possible to solder together a pair of conductor pads 28 on opposite sides of an opening 26 (but same side of second PCB 18) with a pair of conductor pads 32 on opposite sides of first PCB 12.

Figure 4:
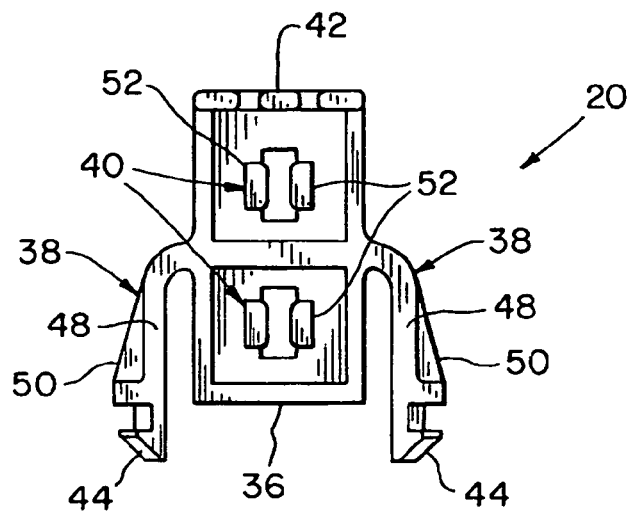
FIG. 4 is a plan view of an embodiment of a circuit board carrier used with the circuit board arrangement shown in FIG. 3.

Referring now to FIGS. 3 and 4, circuit board carriers 20 will be described in greater detail. Each circuit board carrier 20 is configured substantially the same, and thus only a single circuit board carrier 20 will be described in detail herein.

Each circuit board carrier 20 generally includes a flat base 36, pair of wings 38, at least one slot guide 40 and a retainer 42.

Flat base 36 abuts second PCB 16 and provides a wide, stable base to prevent tipping of first PCB 12 relative to second PCB 16. Wings 38 are positioned on laterally opposite sides of base 36. The distal end of each wing 38 includes a snap-in feature 44 which snap engages with a corresponding hole 46 formed in second PCB 16. In the embodiment shown, each snap-in feature 44 is in the form of a harpoon snap feature and each hole 46 is configured as a substantially round hole; however, snap-in feature 44 and hole 46 can be differently configured depending upon the application.

In the embodiment shown, each wing 38 is a generally L-shaped wing including a leg 48, and a stiffening flange 50 extending between leg 48 and snap-in feature 44. Coupling the distal ends of wings 38 with second PCB 16 outside the outboard ends of wide, flat base 36 provides a stable mounting between first PCB 12 and second PCB 16 with a perpendicularity of between +/−2 degrees, preferably with a perpendicularity of between +/−1 degree.

Each circuit board carrier 20 includes a pair of slot guides 40, with each slot guide 40 including a pair of projections 52 spaced apart to receive without substantial clearance a lateral side edge of first PCB 12 therebetween. Of course, it will be appreciated that circuit board carrier 20 can be configured with a single slot guide 40 or more than two slot guides 40, depending upon the application.

Retainer 42 is positioned at and end of circuit board carrier 20 generally opposite from wide, flat base 36. Retainer 42 functions to retain a distal edge 54 of first PCB 12 (opposite first edge connector 14) and prevent float of first PCB 12 in directions toward and away from second PCB 16. In the embodiment shown, retainer 42 is in the form of a retainer lip which lies over and retains a notch 56 at distal edge 54 of first PCB 12. The retainer lip may be a segmented retainer lip, such as shown in the drawings, which can deflect slightly to apply a biasing force against distal edge 54, depending upon the length of and corresponding clearance with first PCB 12.

With a conventional circuit board guide as described above, the guide is installed into the motherboard and the daughterboard is slid into the guide until the edge connectors of the daughterboard and motherboard are mated together. With the circuit board carrier 20 of the present invention, fingers 30 of first edge connector 14 of first PCB 12 are inserted into openings 26 of second edge connector 18 of second PCB 16. A circuit board carrier 20 is then positioned such that slot guides 40 receive a lateral side edge of first PCB 12 therebetween and snap-in features 44 lie adjacent a respective hole 46. Circuit board carrier 20 is then pushed so that the lip on the harpoon snap feature 44 snaps into the back side of hole 46. At the same time the harpoon snap feature 44 locks into place within hole 46, retainer lip 42 seats against or closely adjacent to distal edge 54 of first PCB 12. Circuit board carriers 20 are made from a heat resistant material, such as glass-filled nylon, so that conductor pads 28 and 32 can be soldered together using a wave soldering process as described above.

Using a soldered edged connector between first PCB 12 and second PCB 16, it will be appreciated that it is not intended to remove first PCB 12 from second PCB 16 after the wave soldering operation.

Having described the preferred embodiment, it will become apparent that various modifications can be made without departing from the scope of the invention as defined in the accompanying claims.

The invention claimed is:

1. A circuit board arrangement, comprising:
   a first circuit board including a first edge connector, said first edge connector including a plurality of fingers, each said finger including at least one first conductor pad;
   a second circuit board including a second edge connector, said second edge connector including a plurality of openings positioned generally in line with each other and a plurality of second conductor pads, each said opening having a corresponding said finger positioned therein, each said second conductor pad positioned adjacent a corresponding said opening and corresponding said first conductor pad;
   a base support extending from the first circuit board to support the second circuit board in a generally perpendicular orientation with respect to the first circuit board, the base support have a bottom end near the first circuit board and a top end opposite the bottom end; and
   a plurality of lateral members extending laterally from the base support near or at the top end, each of the lateral members terminating at a distal end in an engaging feature that engages two opposite surfaces of the second circuit board where the engaging feature is spaced laterally apart from the bottom end.

2. The circuit board arrangement of claim 1, including a plurality of solder joints, each said solder joint associated with a respective said finger.

3. The circuit board arrangement of claim 1, wherein each said finger includes a pair of said first conductor pads with one said first conductor pad on one side of said finger and an other said first conductor pad on an opposite side of said finger.

4. The circuit board arrangement of claim 3, wherein each said pair of first conductor pads extends from opposite sides of said second circuit board.

5. The circuit board arrangement of claim 4, wherein said plurality of second conductor pads includes four said second conductor pads associated with each said opening, including two said second conductor pads positioned adjacent a corresponding said opening on one side of said second circuit board, and two said second conductor pads positioned adjacent said corresponding opening on an opposite side of said second circuit board.

6. The circuit board arrangement of claim 5, including a plurality of solder joints, each said solder joint associated with a respective said finger and interconnecting said pair of first conductor pads with said four second conductor pads.

7. The circuit board arrangement of claim 6, wherein each said finger extends through and past a corresponding said opening.

8. The circuit board arrangement of claim 1, wherein said plurality of second conductor pads includes at least one said second conductor pad positioned adjacent each said opening.

9. The circuit board arrangement of claim 8, wherein said plurality of second conductor pads includes at least two said second conductor pads associated with each said opening, including one said second conductor pad positioned adjacent a corresponding said opening on one side of said second circuit board, and an other said second conductor pad positioned adjacent a corresponding said opening on an opposite side of said second circuit board.

10. The circuit board arrangement of claim 9, wherein said one second conductor pad and said other second conductor pad are positioned on a same side of said opening.

11. The circuit board arrangement of claim 8, wherein said plurality of second conductor pads includes at least two said second conductor pads associated with each said opening, including one said second conductor pad positioned adjacent a corresponding said opening on one side of said first circuit board, and an other said second conductor pad positioned adjacent a corresponding said opening on an opposite side of said first circuit board.

12. The circuit board arrangement of claim 11, wherein said one second conductor pad and said other second conductor pad are positioned on opposite sides of said opening.

13. The circuit board arrangement of claim 1, wherein said first circuit board is a daughterboard and said second circuit board is a motherboard.

14. The circuit board arrangement according to claim 1 wherein the base support is composed of one or more of the following: a heat resistant material, plastic, and glass-filled nylon.

\* \* \* \* \*